(12) United States Patent
Gaur (10) Patent No.: US 8,644,432 B2
(45) Date of Patent: Feb. 4, 2014

(54) VITERBI DECODER FOR DECODING CONVOLUTIONALLY ENCODED DATA STREAM

(75) Inventor: Vatsal Gaur, Gurgaon (IN)

(73) Assignee: Freescale Semiconductor, Inc., Austin, TX (US)

( * ) Notice: Subject to any disclaimer, the term of this patent is extended or adjusted under 35 U.S.C. 154(b) by 96 days.

(21) Appl. No.: 13/439,857

(22) Filed: Apr. 5, 2012

(65) Prior Publication Data

US 2013/0266096 A1 Oct. 10, 2013

(51) Int. Cl.
*H04L 27/06* (2006.01)

(52) U.S. Cl.
USPC ........... 375/341; 375/262; 375/265; 714/751; 714/752; 714/794; 714/795; 714/796

(58) Field of Classification Search
USPC .......... 375/262, 265, 341; 714/751, 752, 794, 714/795, 796
See application file for complete search history.

(56) References Cited

U.S. PATENT DOCUMENTS

| | | | |
|---|---|---|---|
| 4,748,626 A | 5/1988 | Wong | |
| 5,912,908 A | 6/1999 | Cesari | |
| 6,148,043 A | 11/2000 | Fujimoto | |
| 6,477,680 B2 * | 11/2002 | Mujtaba | 714/795 |
| 7,114,122 B2 | 9/2006 | Shih | |
| 7,117,426 B2 | 10/2006 | Wu | |
| 7,231,586 B2 | 6/2007 | Prasad | |
| 7,404,139 B2 * | 7/2008 | Prasad et al. | 714/796 |
| 7,979,781 B2 * | 7/2011 | Pisek | 714/795 |
| 8,015,477 B2 | 9/2011 | Stockmanns | |
| 8,255,780 B2 * | 8/2012 | Saha et al. | 714/792 |
| 2005/0157823 A1 | 7/2005 | Sudhakar | |

* cited by examiner

*Primary Examiner* — Leon Flores (74) *Attorney, Agent, or Firm* — Charles Bergere (57) ABSTRACT

A method for operating a Viterbi decoder uses few data move operations to improve efficiency. The Viterbi decoder predicts a state in which the convolution encoder might have operated while generating a convolutionally encoded data stream. The Viterbi decoder maintains a first set of states and based on the received convolutionally encoded data stream, predicts second and third sets of states. The Viterbi decoder then calculates first and second sets of decision bits based on the transitions to the second and third sets of states. Path metric values associated with the third set of states are stored in a memory buffer. Thereafter, during trace-back, the Viterbi decoder extracts first and second decoded bits from first and second sets of decision bits respectively.

15 Claims, 10 Drawing Sheets

VITERBI DECODER FOR DECODING CONVOLUTIONALLY ENCODED DATA STREAM

BACKGROUND OF INVENTION

The present invention relates to a Viterbi decoder and, more specifically, to a processor implementation of a Viterbi decoder with a processor.

Wireless communication is an ever advancing field in which data is transmitted from source to destination through a wireless medium. Typically, the data is transmitted as data packets using various protocols such as IEEE 802.11, IEEE 802.16, Global System for Mobile (GSM), and Code Division Multiple Access (CDMA). Data packets transmitted wirelessly are prone to noise, which can either cause some packets to be lost or corrupted. Such lost data packets cannot be recovered and have to be retransmitted to the destination. On the other hand, corrupted data packets can be recovered using various Forward Error Correction (FEC) codes. Some commonly used FEC codes are convolution codes, Reed-Solomon code, BCH code, etc. Of the above mentioned FEC codes, convolution codes are the most commonly used. Prior to the transmission, the data packets are convolutionally encoded by a convolution encoder. At the destination, the data packets are decoded using a Viterbi decoder.

A Viterbi decoder is a maximum likelihood decoder that receives a convolutionally encoded data stream from a data source. After reception of a convolutionally encoded data stream, the Viterbi decoder predicts state of the convolution encoder based on the received convolutionally encoded data stream. For that, the Viterbi decoder maintains a register for storing a plurality of bits representing the state of the convolution encoder. For example, if the convolutionally encoded data stream was generated by a convolution encoder having constraint length 'K', then the Viterbi decoder would use 'K−1' bits to represent the state of the convolution encoder. Thus, there can be $2^{k-1}$ expected states of the convolution encoder. Hereinafter, $2^{k-1}$ expected states is referred to as a first set of states. Each state in this first set of states has an associated path metric value. Based on the convolutionally encoded data stream, the Viterbi decoder predicts a second set of states. The second set of states is the next expected state of the first set of states. For each state in the second set of states the Viterbi decoder calculates a new path metric value based on the path metric value associated with the first set of states. Consequently, the Viterbi decoder calculates a set of decision bits based on the new path metric values. The set of decision bits is stored in a trace back register, and the new path metric values are stored in a memory buffer.

Subsequent to generation of the set of decision bits, the Viterbi decoder operates in a trace back mode. In the trace back mode the Viterbi decoder selects a state having the best path metric value from the second set of states. Thereafter, the Viterbi decoder extracts a decision bit from the trace back register based on the selected state. The extracted decision bit is the decoded data bit.

Thus, the Viterbi decoder predicts the second set of states. Each state in the second set of states has an associated path metric value. Thus, a processor that is configured to implement the Viterbi decoder has to perform multiple data move operations to retrieve the path metric values and the set of decision bits from the memory buffer and the trace back register respectively. Such data move operations may consume many processor clock cycles and thus may slow down the overall decoding process.

Thus, there is a need for a Viterbi decoder that is more efficient and uses less processor clock cycles to decode the convolutionally encoded data stream.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for decoding a convolutionally encoded data stream using a Viterbi decoder is provided. The method includes reading a first set and a second set of soft decision values from a first memory buffer. Thereafter, a first set and a second set of branch metric values are calculated based on the first and the second set of soft decision values. The method further includes reading a first set of path metric values and a second set of path metric values from a second memory buffer, in which the first and the second set of path metric values correspond to a first set of states and a second set of states respectively. Subsequent to the reading of the first and the second set of path metrics, a third set of path metric values is calculated based on at least one of the first set of path metric values and the first set of branch metric values. Based on the third set of path metric values, a first set of decision bits are generated. Thereafter, a fourth set of path metric values is calculated based on at least one of the second set of path metric values and the first set of branch metric values, in which the third set of path metric values and the fourth set of path metric values correspond to a third and a fourth set of states respectively. Further, the third and the fourth set of states are the next expected states of the first and the second sets of states respectively. Based on the fourth set of path metric values, a second set of decision bits are generated. Additionally, the method includes calculating a fifth set of path metric values for a fifth set of states, in which the fifth set of path metric values is calculated based on at least one of the third set of path metric values, the fourth set of path metric values and the second set of branch metric values. The fifth set of states is the next expected state of the third and fourth sets of states. The fifth set of path metric values is stored in the second memory buffer. Based on the fifth set of path metric values a third set of decision bits are generated. Consequently, the first, second, and third sets of decision bits are stored in a trace back register. Based on the first, second, and third sets of decision bits, the convolutionally encoded data stream is decoded.

In accordance with another embodiment of the present invention, a method for operating a Viterbi decoder in a trace back mode is provided. The method includes obtaining a first state of the Viterbi decoder, in which the first state is represented by a binary number that includes a plurality of bits. Thereafter, a first predetermined number of most significant bits from the binary number is extracted to generate an offset value. The remaining bits of the binary number form an index value. Subsequent to the generation of the offset value and the index value, a trace back register, storing a plurality of decision bits, is read. A first decoded bit is extracted from the plurality of bits based on the offset value and the index value. Thereafter, a second decoded bit is extracted from the trace back register based on the value of the first decoded bit. The first and the second decoded bit are provided as the most recent decoded data bits.

Various embodiments of the present invention provide systems and methods for operating a Viterbi decoder. The Viterbi decoder receives a convolutionally encoded data stream. The convolutionally encoded data stream includes a stream of soft decision values. The stream of the soft decision values is stored in a first memory buffer. The Viterbi decoder reads the first and a second set of soft decision values from the first memory buffer. Based on the first and second set of soft decision values, the Viterbi decoder calculates a first and a second set of branch metric values. Further, the Viterbi decoder reads a first and a second set of path metric values from a second memory buffer. The first and the second set of path metric values correspond to a first and a second set of states. Thereafter, the Viterbi decoder calculates a third and fourth set of path metric values from the first and second set of path metric values respectively. The third and the fourth set of path metric values correspond to a third and fourth set of states. The third and fourth sets of states are the next expected states of the first and the second set of states respectively. Based on the third and fourth sets of path metric values the Viterbi decoder calculates a first and a second set of decision bits respectively. Further, the Viterbi decoder calculates a fifth set of path metric values based on at least one of one or more of the third and the fourth set of path metric values and the second set of branch metric values. Consequently, the Viterbi decoder stores the fifth set of path metric values in the second memory buffer. Further, the Viterbi decoder generates and stores a third set of decision bits in the trace back register.

The Viterbi decoder does not store the third and fourth sets of path metric values but stores the fifth set of path metric values. Further, the Viterbi decoder uses the third and fourth sets of path metric values to calculate the fifth set of path metric values. Further, during the trace-back, the Viterbi decoder extracts more than one decoded bit from the trace-back register in a single data read operation. Thus, clock cycles that were being used in memory read write operations in the conventional Viterbi decoder implementations has been reduced. This reduced usage of the clock cycles accelerates the overall decoding procedure of the Viterbi decoder.

Figure 1:
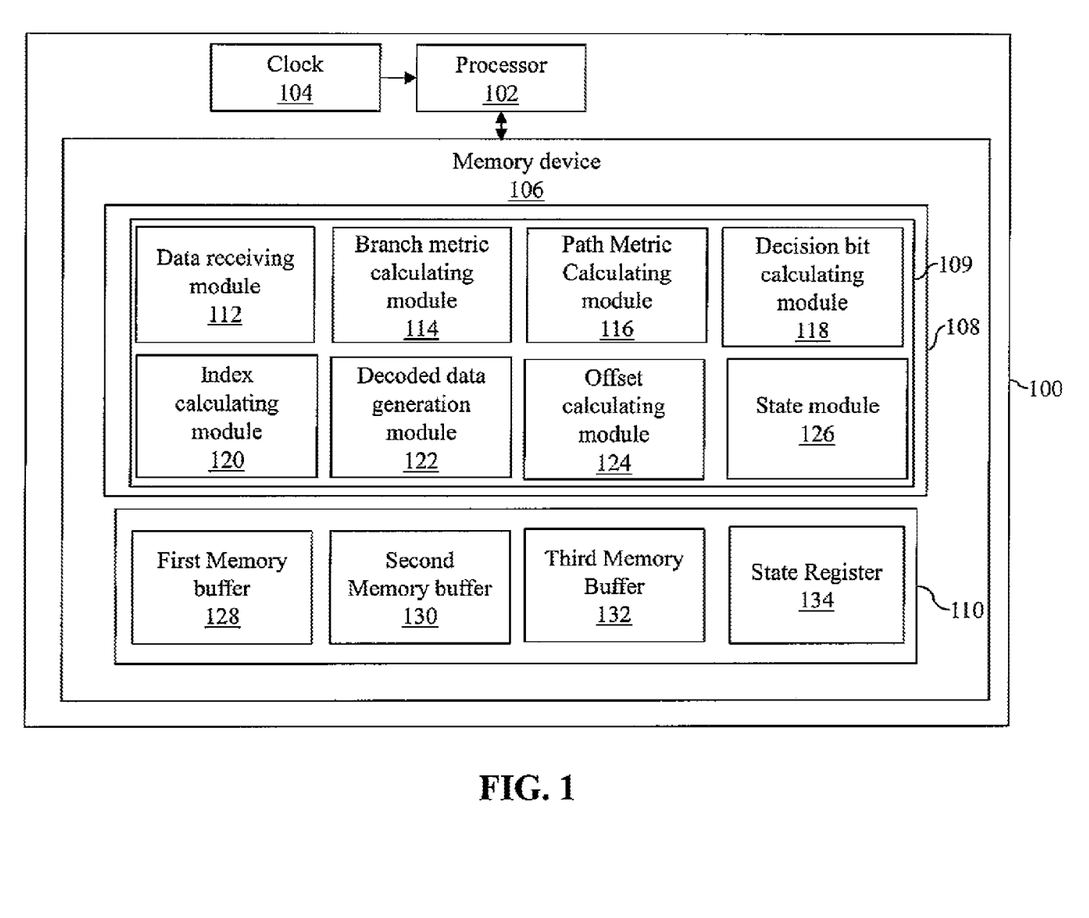
FIG. 1 is a schematic block diagram of a digital signal processor in accordance with an embodiment of the present invention.

FIG. 1 is a schematic block diagram of a digital signal processor (DSP) 100 in accordance with an embodiment of the present invention. The DSP 100 includes a processor 102, a clock signal generator 104, and a memory device 106. The DSP 100 receives a convolutionally encoded data stream (Not Shown) from an external source (Not Shown).

Turning to FIG. 1, the processor 102 is coupled to the memory device 106 and the clock signal generator 104. The processor 102 is configured to execute set of instructions stored in the memory device 106. The processor 102 can be realized through a number of processor technologies known in the art. Examples of the processor 102 can be X86 processor, RISC processor, ASIC processor, CSIC processor, or any other processor.

The clock signal generator 104 is coupled to the processor 102. The clock signal generator 104 generates a clock signal that is transmitted to the processor 102. Examples of the clock signal generator 104 can be a crystal oscillator, a Phase Locked Loop (PLL) based oscillator or any other oscillator circuit. Further the clock signal generator 104 can either be embedded on same chip as that of the processor 102 or can be external to the processor 102.

The memory device 106 is configured to store a set of instructions or modules. Some of the commonly known memory device implementations can be, but not limited to, a random access memory (RAM), read only memory (ROM), hard disk drive (HDD), and secure digital (SD) card. Further, the memory device 106 includes a program module partition 108 and a program data partition 110. The program module partition 108 includes set of instructions that can be executed by the processor 102 to perform specific actions on the digital signal processing device 100. The program module partition 108 includes a Viterbi decoder module 109 that further includes a data receiving module 112, a branch metric calculating module 114, a path metric calculating module 116, a decision bit calculating module 118, an index calculating module 120, a decoded data generating module 122, an offset calculating module 124, and a state module 126. A person skilled in the art will know that the set of instructions stored in the memory device 106 interact with the hardware of the digital signal processing device 100 to perform a predetermined operation. Further, the program data partition 110 of the memory device 106 includes a first memory buffer 128, a second memory buffer 130, a third memory buffer 132, and a state register 134.

In operation, the data receiving module 112, in the Viterbi decoder module 109, receives the convolutionally encoded data stream from an external source (Not Shown). In an embodiment, the external source can be, but not limited to, a mobile device, a mobile station, IEEE 802.11 complaint device, GSM complaint device or CDMA complaint device. The convolutionally encoded data stream includes a stream of soft decision values and a stream of encoded data. The data receiving module 112 stores the stream of soft decision values and the stream of encoded data in the first memory buffer 128. Prior, to the reception of the convolutionally encoded data stream, the external source generates the convolutionally encoded data stream through a convolution encoder. The convolution encoder generates the convolutionally encoded data stream based on a constraint length. For instance, the constraint length associated with the convolution encoder is 'K'. Then at any instance, 'K−1' bits will be used to define the state of the convolution encoder.

For decoding the convolutionally encoded data stream the Viterbi decoder module 109 predicts the state of the convolution encoder. Since, 'K−1' bits are used to represent the state of the convolution encoder, there can be $2^{K-1}$ possible states of the convolution encoder. Further, in order to decode the convolutionally encoded data stream the Viterbi decoder module 109 operates in a forward trace mode and a backward trace mode. An exemplary forward trace mode operation of the Viterbi decoder module 109 is explained in conjunction with FIG. 2, FIG. 3, and FIG. 4. An exemplary backward trace mode operation of the Viterbi decoder module 109 is explained in conjunction with FIG. 5, FIG. 6, and FIG. 7.

Figure 2:
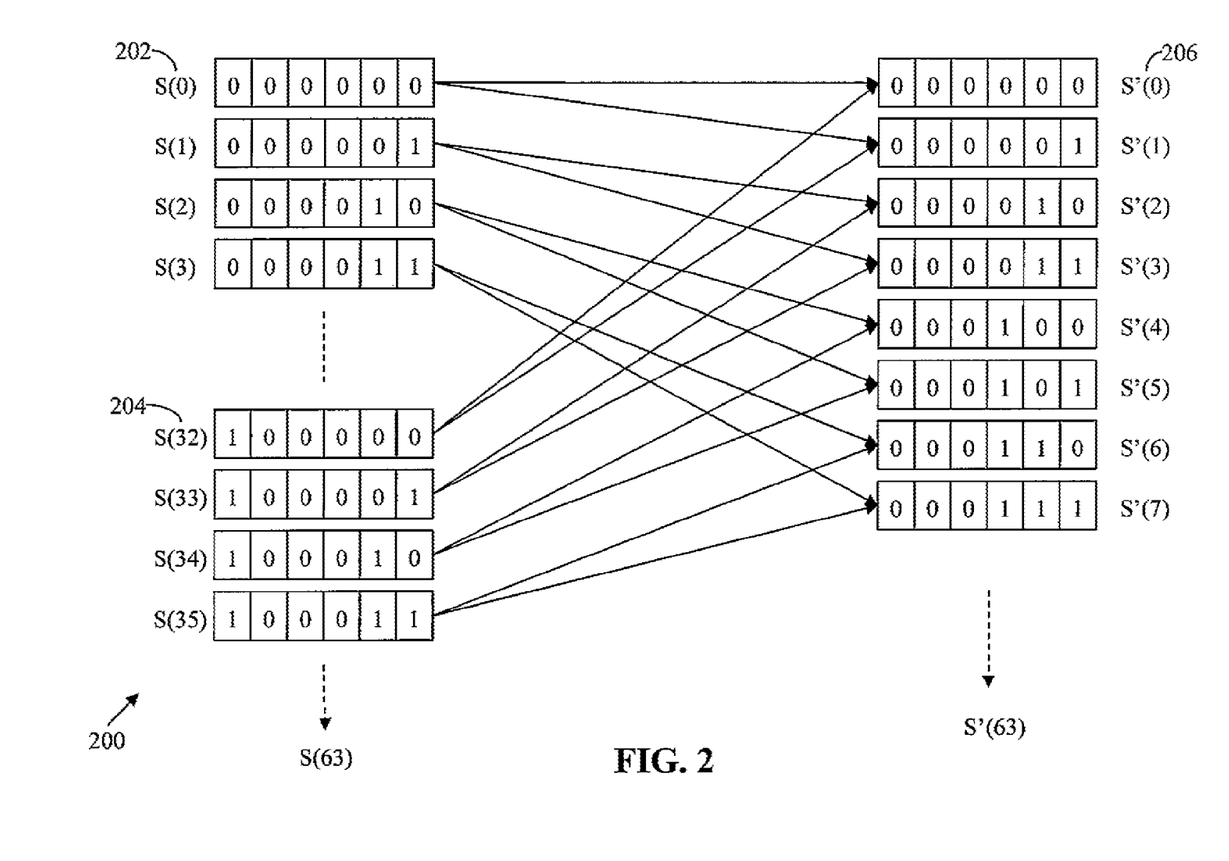
FIG. 2 is a butterfly diagram in accordance with an embodiment of the present invention.

FIG. 2 illustrates an butterfly diagram 200 in accordance with an exemplary embodiment of the present invention. For the exemplary embodiment, the value of K is '7'. Thus, there are 64 possible states of the convolution encoder. The butterfly diagram 200 illustrates a first set of expected states S(0), S(1), S(2), . . . , S(63), and a second set of expected states S'(0), S'(1), S'(2), . . . , S'(63). In an embodiment, the second set of expected states S'(0), S'(1), S'(2), . . . , S'(63) is the next expected states of the first set of expected states S(0), S(1), S(2), . . . , S(63).

Figure 3:
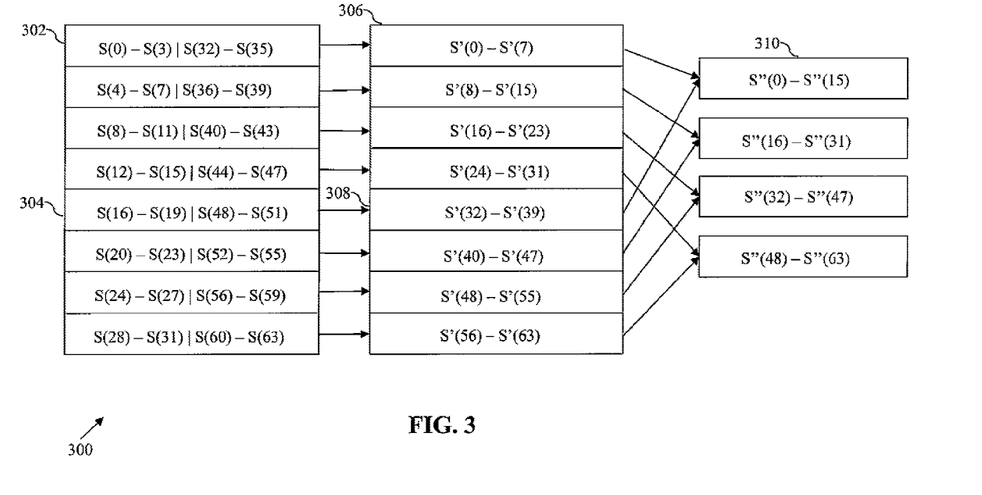
FIG. 3 is another butterfly diagram in accordance with an embodiment of the present invention.

FIG. 3 illustrates another butterfly diagram 300 in accordance with the exemplary embodiment of the present invention. The butterfly diagram 300 illustrates the first set of expected states S(0), S(1), S(2), . . . , S(63), the second set of expected states S'(0), S'(1), S'(2), . . . , S'(63), and a third set of expected states S"(0), S"(1), S"(2), . . . , S"(63).

Figure 4:
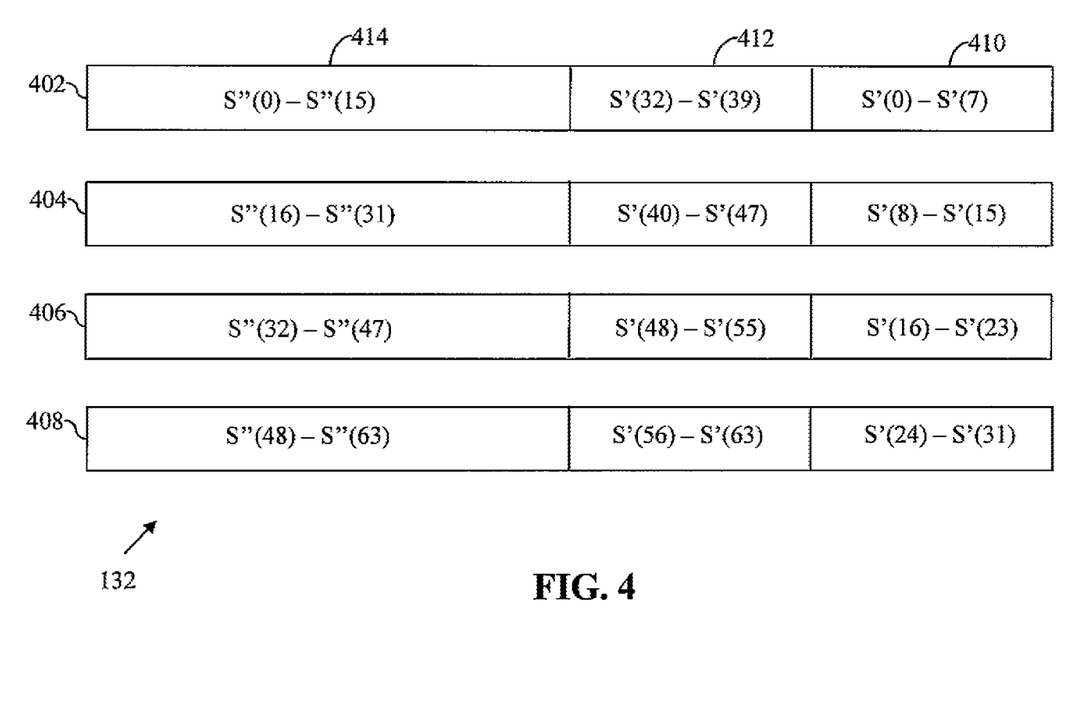
FIG. 4 illustrates an exemplary implementation of a third memory buffer in accordance with an embodiment of the present invention.

FIG. 4 illustrates an exemplary implementation of the third memory buffer 132 in accordance with the exemplary embodiment of the present invention. The third memory buffer 132 includes a first trace back register 402, a second trace back register 404, a third trace back register 406, and a fourth trace back register 408. The first trace back register 402 further includes a first section 410, a second section 412, and a third section 414. Similarly, the second, third and the fourth trace back registers 404, 406, 408 have a first section, a second section, and a third section.

Figure 5:
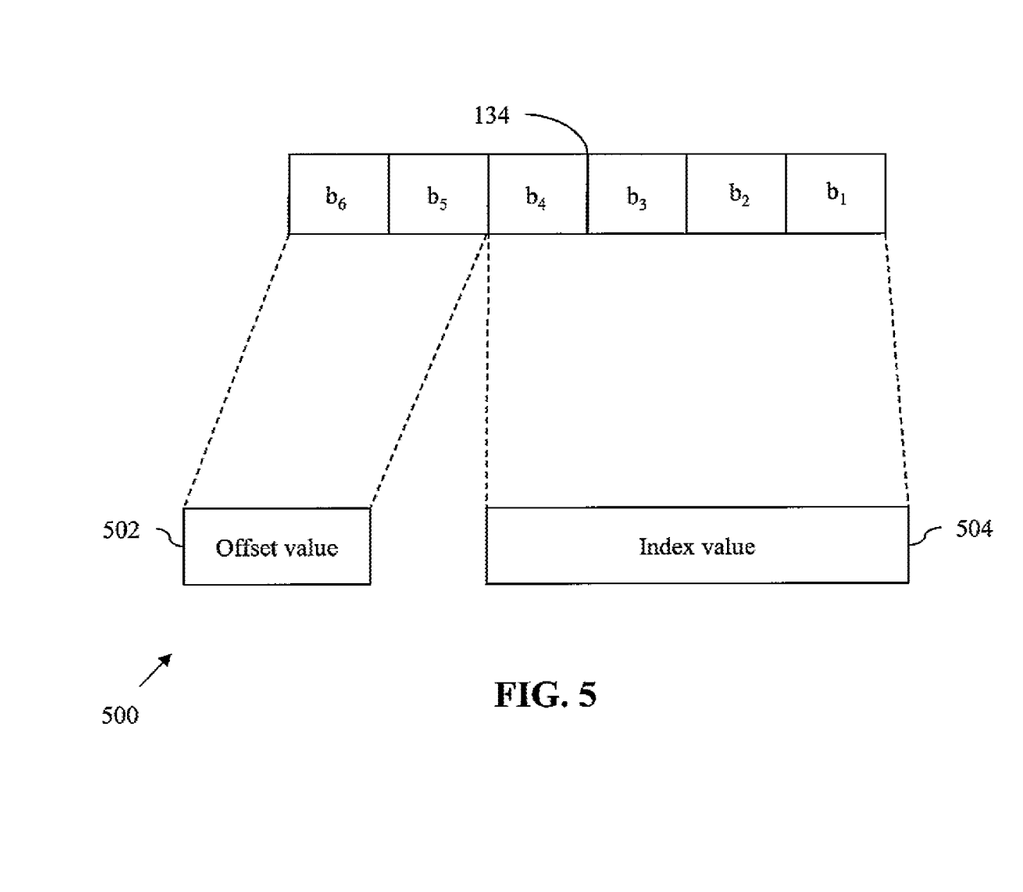
FIG. 5 illustrates an exemplary implementation of a state register in accordance with an embodiment of the present invention.

FIG. 5 illustrates an exemplary implementation of the state register 134 in accordance with the exemplary embodiment of the present invention.

Figure 6:
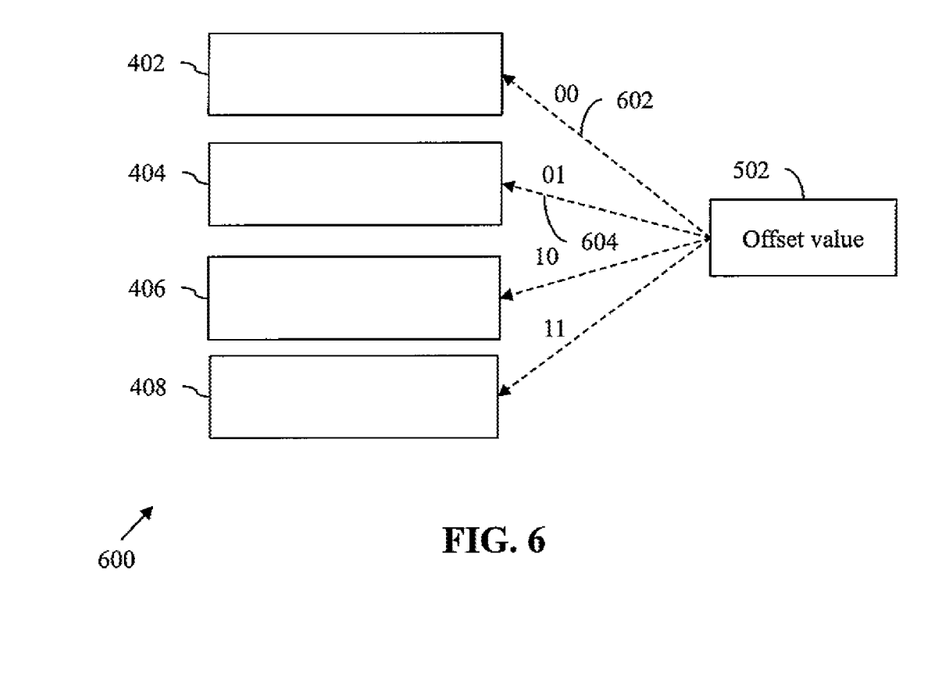
FIG. 6 illustrates selection of a trace back register from a third memory buffer in accordance with an embodiment of the present invention.

FIG. 6 illustrates selection of a trace back register from the third memory buffer 132 in accordance with the exemplary embodiment of the present invention.

Figure 7:
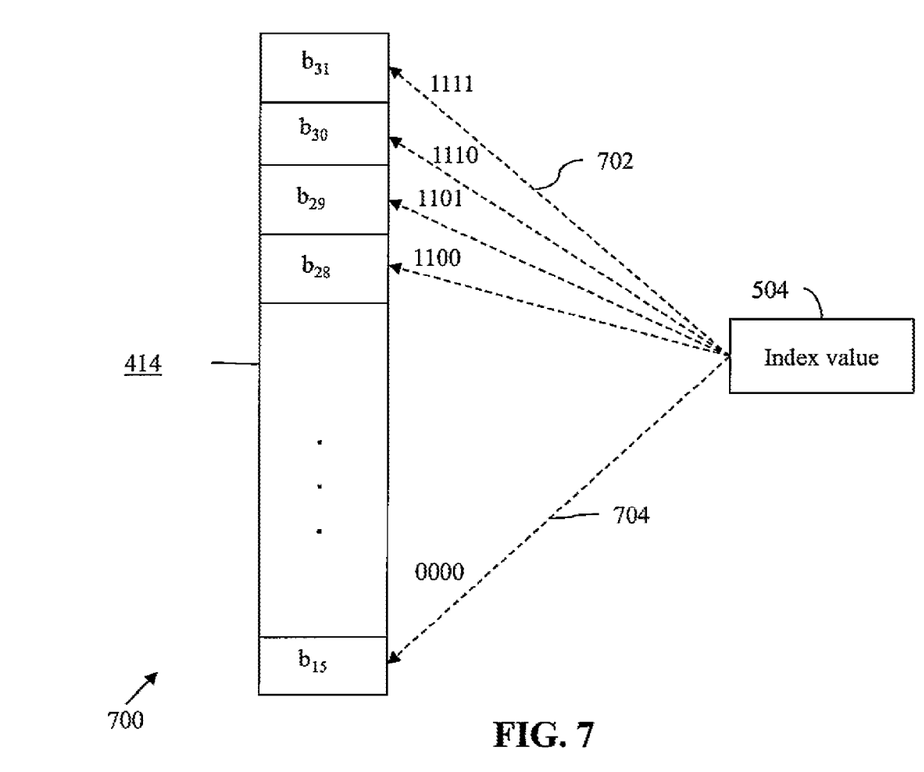
FIG. 7 illustrates extraction of a decoded bit from a section of a trace back register in accordance with an embodiment of the present invention.

FIG. 7 illustrates extraction of a decoded bit from a section of a trace back register in accordance with the exemplary embodiment of the present invention.

Turning to FIG. 2, each state in the first set of expected states S(0), S(1), S(2), . . . , S(63) can have at least two possible next states in the second set of expected states S'(0), S'(1), S'(2), . . . , S'(63). For instance, The present state of the convolution encoder is '000000' depicted by state S(0) 202. The Viterbi decoder module 109 considers two possibilities that the convolution encoder might have gone through while generating the convolutionally encoded data stream. First of the two possibilities is that the convolution encoder might have received an input bit '0' which would lead to an next state of '000000' depicted by state S'(0) 206. Second of the two possibilities is that the convolution encoder might have received an input bit '1' which would have lead to next state of '000001' depicted by state S'(1) 208. Thus, each state in the first set of expected states S(0), S(1), S(2), . . . , S(63) can lead to at least two states in the second set of expected states S'(0), S'(1), S'(2), . . . , S'(63). Likelihood that a state in the first set of expected states S(0), S(1), S(2), . . . , S(63) lead to a next state in the second set of expected states S'(0), S'(1), S'(2), . . . , S'(63) is known as branch metric. Further, based on the branch metric, each state in the second set of expected states S'(0), S'(1), S'(2), . . . , S'(63) is assigned a weightage known as a path metric.

Further, from FIG. 2 it can be observed that at least two states in the first set of expected states S(0), S(1), S(2), . . . , S(63) can lead to same two states in the second set of expected states S'(0), S'(1), S'(2), . . . , S'(63). For instance, state S(0) 202 can lead to state S'(0) 206 or state S'(1) 208 based on the input bit. Similarly, state S(32) 204 can lead to state S'(0) 206 or state S'(1) 208 based on the input bit. Thus states S(0) to S(3) and states S(32) to S(35) can lead to states from S'(0) to S'(7) based on the input bit.

Turning back to FIG. 1, the branch metric calculating module 114 retrieves a first set of soft decision values and a second set of soft decision values from the first memory buffer 128. Based on the first and the second set of soft decision values the branch metric calculating module 114 calculates a first and a second set of branch metric values. The first set of branch metric values include a plurality of likelihood values for each state in the first set of expected states S(0), S(1), S(2), . . . , S(63). The second set of branch metric values include a plurality of likelihood values for each state in the second set of expected states S'(0), S'(1), S'(2), . . . , S'(63).

Subsequent to the generation of the first and second set of branch metric values, the state module 126 reads a first set of states and a second set of states from the first set of expected states S(0), S(1), S(2), . . . , S(63). The first set of states correspond to states S(0) to S(3) and S(32) to S(35) 302 (Refer FIG. 3) and the second set of states correspond to states S(16) to S(19) and S(48) to S(51) 304. The first set of states S(0) to S(3) and S(32) to S(35) 302 can lead to a third set of states S'(0) to S'(7) 306 as explained above in conjunction with FIG. 2. Similarly, the second set of states S(16) to S(19) and S(48) to S(51) 304 can lead to a fourth set of states S'(32) to S'(39) 308. The first set of branch metric values include values corresponding to the likelihood that the first and second set of states 302, 304 lead to the third and the fourth set of states 306, 308 respectively. Further, the first and the second set of a states 302, 304 have a first and a second set of path metric associated with them. The path metric calculating module 116 reads the first set and the second set of path metric values associated with the first and the second set of states 302, 304 respectively from the second memory buffer 130. Thereafter, the path metric calculating module 114 calculates a third set of path metric values based on the first set of path metric values and the first set of branch metric values. Further, the path metric calculating module 114 calculates a fourth set of path metric values based on the second set of path metric values and the first set of branch metric values. The third set of path metric correspond to the third set of states S'(0) to S'(7) 306 and the fourth set of path metric correspond to the fourth set states S'(32) to S'(39) 308.

Based on the third and the fourth set path metric values, the decision bit calculating module 118 generates a first and a second set of decision bits. The first and the second set of decision bits include a plurality of bits represented by binary digits '1' or '0'. The plurality of bits are the possible input bits that the convolution encoder might have received such that the first and the second set of states switch to the third and the fourth set of states respectively.

Subsequent to the generation of the first and the second set of decision bits, the path metric calculating module 116, calculates a fifth set of path metric values based on third set of path metric values, fourth set of path metric values, and second set of branch metric values. Further, the path metric calculating module 116 stores the fifth set of path metric values in the second memory buffer 130. The fifth set of path metric values corresponds to a fifth set of states S"(0) to S"(15) 310. The fifth set of states 310 is the next expected states of the third and the fourth set of states 306, 308.

The decision bit calculating module 118 generates a third set of decision values based on the fifth set of path metric values. Further, the decision bit calculating module stores the first, the second and the third set of decision bits in the third memory buffer 132. In the exemplary embodiment explained in conjunction with FIG. 2 the first, second and third set of decision bits are stored in the first section 410 (Refer FIG. 4), the second section 412, and the third section 414 of the first trace back register 402 respectively. The Viterbi decoder module 109 calculates decision bits for the remaining states and stores them in the remaining trace back registers in the third memory buffer 132, as described above.

Subsequent to the calculation of the decision bits for every possible state, the Viterbi decoder module 109 starts operating in the trace back mode. In the trace back mode, the state module 126 reads the fifth set of path metric values for each state in the third set of expected states S"(0), S"(1), S"(2), . . . , S"(63). Based on the fifth set of path metric values, the state module 126 selects a first state from the third set of expected states S"(0), S"(1), S"(2), . . . , S"(63). In an embodiment, the first state has a maximum path metric value in comparison to path metric values corresponding to the rest of the states in the third set of expected states S"(0), S"(1), S"(2), . . . , S"(63). In an alternative embodiment, the first state has a minimum path metric value in comparison to path metric values corresponding to the rest of the states in the third set of expected states S"(0), S"(1), S"(2), . . . , S"(63). A person skilled in the art would appreciate that only that path metric value is selected which has the maximum probability of being associated with the next expected state of the convolution encoder. Therefore, the invention should not be limited to selection of maximum or minimum path metric value. Thereafter, the state module 126 stores the first state in the state register 134.

The offset calculating module 124 retrieves the first state from the state register 134. Further, the offset calculating module 124 extracts a predetermined number MSBs from the first state to generate an offset value 502 (Refer FIG. 5). Thereafter, the index calculating module 120 retrieves the remaining bits from the first state to generate an index value 504. In the exemplary embodiment explained in conjunction with FIG. 2, the first state is defined by 6 bits. The offset value 502 includes two MSB of the first state, i.e. bit $b_6$ and bit $b_5$. Thus, remaining four bits of the first state will constitute the index value 504.

The decoded data generating module 122 selects a trace back register from the third memory buffer 132 based on the offset value 502. For instance, the offset value 502 is '00', then the first trace back register 402 is selected, depicted by 602 (Refer FIG. 6). Similarly, if the offset value 502 is '01', then the second trace back register 404 is selected, depicted by 604. For instance, the first trace back register 402 is selected. After the selection of the first trace back register 402, the index value 504 is used for extracting a first decoded bit from the first trace back register 402. It should be know to a person skilled in the art that the index value 504 has been extracted from the first state that was further extracted from the third set of expected states S"(0), S"(1), S"(2), . . . , S"(63). Thus the index value 504 points to the third section 414 of the first trace back register 402 that stores the third set of decision bits corresponding to the third set of expected states S"(0), S"(1), S"(2), . . . , S"(63). Based on the index value 504, the decoded data generating module 122 extracts a first decoded bit from the third section 414 of the first trace back register 402. For instance, the index value 504 is '1111', then bit $b_{31}$ is extracted from the third section 414 of the first trace back register 402, depicted by 702 (Refer FIG. 7). Similarly, if the index value 504 is '0000', then bit $b_{15}$ is extracted from the third section 414 of the first trace back register 402, depicted by 704. The extracted bit is a first decoded bit.

Subsequent to the generation of the first decoded bit, the decoded data generating module 122 checks, whether the decoded bit is '1' or '0'. If it is found that the first decoded bit is '1', the second section 412 of the first trace back register 402 is selected. However, if it is found that the first decoded bit is '0', the first section 410 of the first trace back register 402 is selected. Further, the decoded data generating module 122 right shifts the content of the state register 134, using the first decoded bit, to generate a second state. The second state corresponds to the previous state of the first state. Thereafter, the index calculating module 120 extracts a predetermined number of LSB from the second state to generate a new index value. The decoded data generating module 122 extracts a second decoded bit from the selected section of the first trace back register 402.

For instance, the first state is '001111' and the first decoded bit is '1'. Since, the first decoded bit is '1', hence the second section 412 of the first trace back register 402 is selected. Further, the first decoded bit '1' right shifts the content of the state register 134 to generate the second state. The second state is '100111'. The index calculating module 120 extracts three least significant bits from the second state to generate the new index value i.e. '111'. The decoded data generating module 122 extracts the second decoded bit based on the new index value. Since the new index value is '111', bit $b_{15}$ is the second decoded bit. Similarly, if the new index value is '100', bit $b_{12}$ is the second decoded bit. The first and the second decoded bit are provided as the most recent decoded bits.

In an embodiment, the second decoded bit can be extracted from the trace back register based on equation 1 and equation 2 illustrated below:

If the first decoded bit is '0':

$$\text{Second decoded bit location} = \text{New Index value} \qquad (1)$$

If the first decoded bit is '1':

$$\text{Second decoded bit location} = \text{New Index value} + m \qquad (2)$$

m: m is the total number of states in the first set of states
New index value: New index value is the LSB of index value obtained after right shifting the index value with first decoded bit.

Figure 8A:
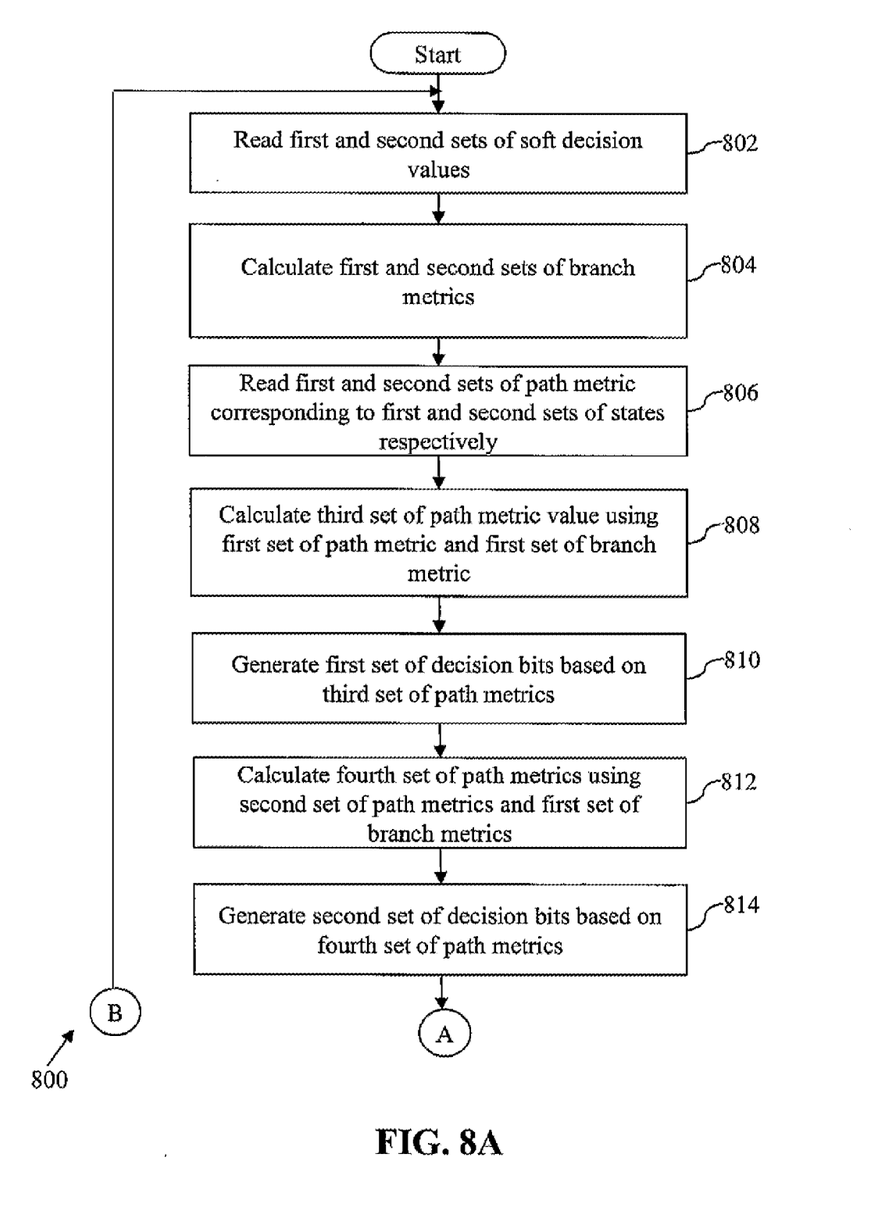
FIGS. 8A and 8B illustrate a flowchart of a method to operate a Viterbi decoder module in a forward trace mode in accordance with an embodiment of the present invention.
Figure 8B:
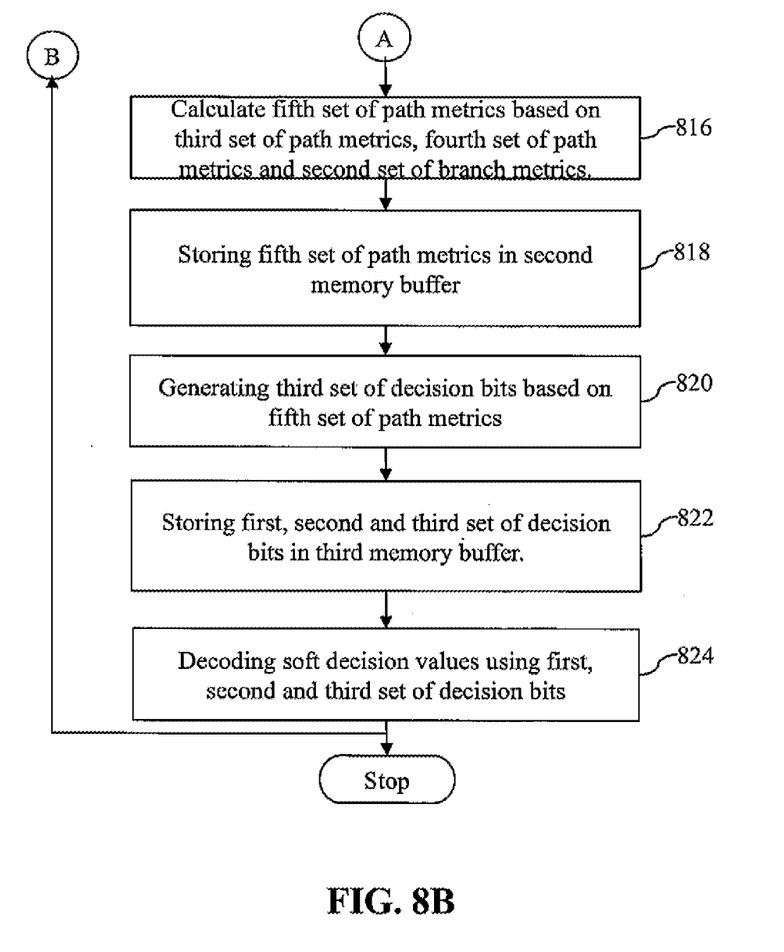

FIGS. 8A and 8B illustrate a flowchart 800 of a method to operate a Viterbi decoder module in a forward trace mode in accordance with an embodiment of the present invention. The flowchart 800 is explained in conjunction with FIGS. 1, 3 and 4.

At step 802, the first and the second set of soft decision values are read by the branch metric calculating module 114 (Refer FIG. 1). Prior to the reading of the first and second set of soft decision values, the digital signal processing device 100 receives a convolutionally encoded data stream. The convolutionally encoded data stream includes a stream of the soft decision values. The stream of soft decision values is stored in the first memory buffer 128.

At step 804, the branch metric calculating module 114 calculates a first set of branch metric values and a second set of branch metric values based on the first and the second set of soft decision values respectively. The first set of branch metric values corresponds to a likelihood that the states in a first set of expected states lead to states in a second set of expected states. Similarly, the second set of branch metric values correspond to a likelihood that the states in the second set of expected states lead to states in a third set of expected states.

At step 806, a first set of path metric values and a second set of path metric values are read from the second memory buffer 130 by the path metric calculating module 116. The first set of path metric values correspond to the first set of states 302 (Refer FIG. 3) from the first set of expected states. The second set of path metric values corresponds to the second set of states 304 from the first set of expected states.

Thereafter, at step 808, the path metric calculating module 116 calculates a third set of path metric values based on the first set of path metric values and the first set of branch metric values. The third set of path metric values corresponds to the third set of states 306 in the second set of expected states. The third set of states 306 is the next expected states of the first set of states 302.

At step 810, the decision bit calculating module 118 calculates a first set of decision bits based on the third set of path metric values. Subsequently, at step 812, a fourth set of path metric values is calculated, by the path metric calculating module 116, based on the second set of path metric values. The fourth set of path metric values correspond to the fourth set of states 308.

At step 814, a second set of decision values is calculated, by the decision bit calculating module 118, based on the fourth set of path metric values. Subsequently, at step 816, the path metric calculating module 116 calculates a fifth set of path metric values based on the third set of path metric values, the fourth set of path metric values and the second set of branch metric values. The fifth set of path metric values correspond to the fifth set of states 310 in the third set of expected states. The fifth set of states 310 is the next expected states of third and fourth set of states 306, 308.

Thereafter, at step 818, the path metric calculating module 116 stores the fifth set of path metric values in the second memory buffer 130. At step 820, the decision bit calculating module 118 calculates a third set decision bits based on the fifth set of path metric values.

At step 822, the first, second, and third set of decision bits are stored in the third memory buffer 132. The third memory buffer 132 includes the first trace back register 402 (Refer FIG. 4), the second trace back register 404, the third trace back register 406, and the fourth trace back register 408. In the exemplary embodiment explained in conjunction with FIG. 2, the first, second, and third set of decision bits are stored in the first, second, and third section 410, 412, 414, respectively, of the first trace back register 402.

At step 824, the decoded data generating module 122 decodes the convolutionally encoded data based on the first, second, and third set of decision values.

Figure 9:
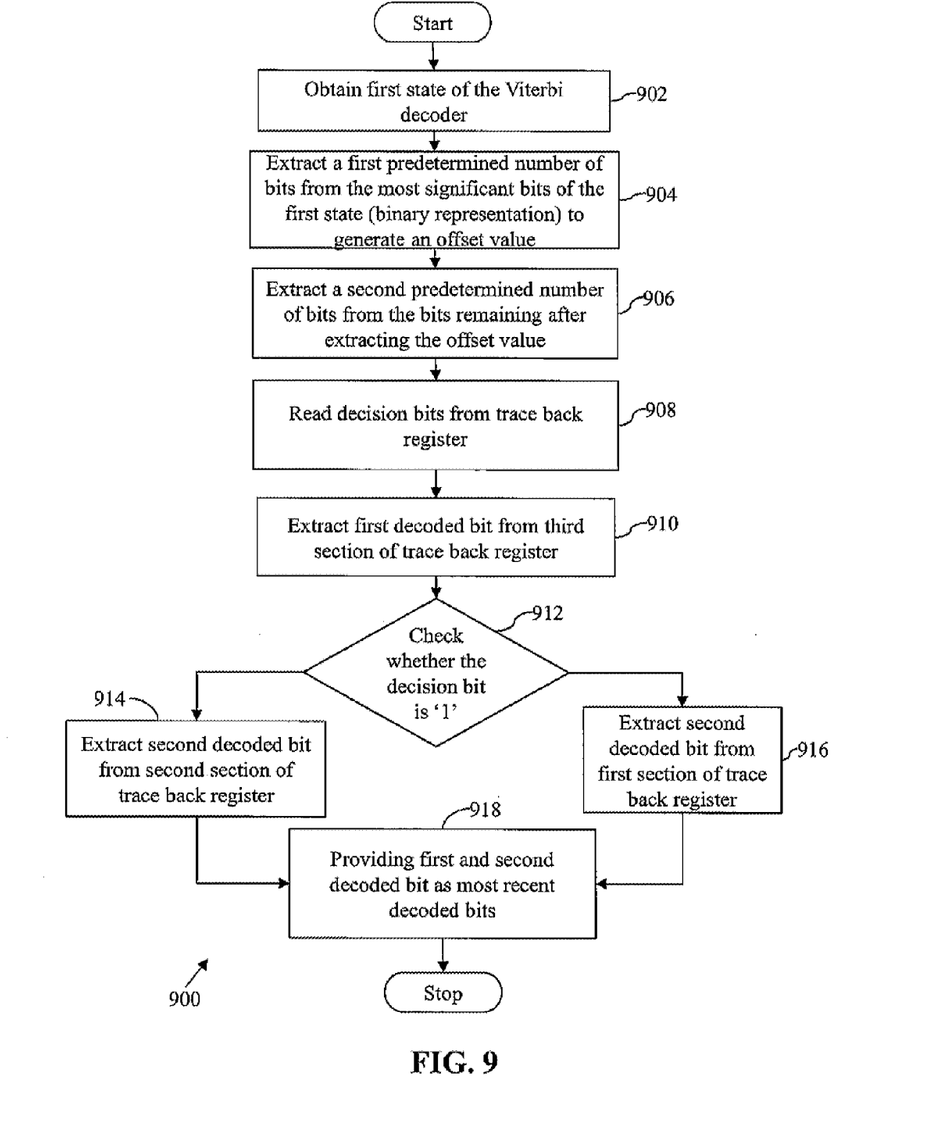
FIG. 9 is a flowchart illustrating a method for operating a Viterbi decoder module in a trace back mode in accordance with an embodiment of the present invention.

FIG. 9 illustrates a flowchart 900 illustrating a method to operate a Viterbi decoder module in a trace back mode in accordance with an embodiment of the present invention. The flowchart 900 is explained in conjunction with FIG. 1, FIG. 4, FIG. 5, FIG. 6, FIG. 7.

At step 902, the state module 126 obtains a first state from a third set of expected states. Prior to obtaining the first state, the state module 126 reads a fifth set of path metric associated with the third set of expected states. Thereafter, the state having the maximum path metric value is selected as the first state.

At step 904, the offset calculating module 124 extracts a predetermined number of most significant bits from the first state to generate the offset value 502 (Refer FIG. 5). Thereafter, at step 906, the index calculating module 120 extracts the remaining bits from the first state to generate the index value 504. Based on the offset value 502, the decoded data generating module 122 selects a trace back register from the third memory buffer 132. For instance, the offset value is "00", then the first trace back register 402 (Refer FIG. 4) is selected as depicted by 602 (Refer FIG. 6).

Further, at step 908, the decoded data generating module 122 reads decision bits stored in the selected trace back register. Thereafter, at step 910, the decoded data generating module 122 extracts a first decoded bit from the selected trace back register based on the index value 504. In an exemplary embodiment, the index value 504 extracts from the decoded bit from the third section 414 of the first trace back register 402. For instance, the index value 504 is "1111", then bit $b_{31}$ is extracted from the third section 414 of the first trace back register 402, depicted by 702 (Refer FIG. 7).

At step 912, a check is performed of whether the decoded bit value is "1". If yes, then step 914 is performed. At step 914, a second decoded bit is extracted from the second section 412 of the selected trace back register. However, if at step 912 it is determined that the decoded bit value is "0", then step 916 is performed. At step 916, the second decoded bit is extracted from the first section 410 of the selected trace back register. Finally at step 918, the first and second decoded bits are provided as the most recent decoded bits.

A person skilled in the art will appreciate that extraction of two bits during trace back has been explained to serve as an example, and is in no way intended to limit the scope of the invention. It will be appreciated that more than two bits can be extracted during trace back depending on the length of the trace back register. For example, if the trace back register is 128 bits, the total number of bits extracted would be three.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for decoding a convolutionally encoded data stream using a Viterbi decoder, the method comprising:

reading first and second sets of soft decision values from a first memory buffer;

calculating first and second sets of branch metric values based on the first and second set of soft decision values;

reading first and second sets of path metric values from a second memory buffer, wherein the first and second sets of path metric values correspond to first and second sets of states respectively;

calculating a third set of path metric values based on at least one of the first set of path metric values and the first set of branch metric values;

generating a first set of decision bits based on the third set of path metric values;

calculating a fourth set of path metric values based on at least one of the second set of path metric values and the first set of branch metric values, wherein the third and fourth sets of path metric values correspond to third and fourth sets of states respectively, and wherein the third and fourth sets of states are the next expected states of the first and second sets of states respectively;

generating a second set of decision bits based on the fourth set of path metric values;

calculating a fifth set of path metric values for a fifth set of states based on at least one of the third set of path metric values, the fourth set of path metric values and the second set of branch metric values, wherein the fifth set of states is the next expected state of the third and fourth sets of states;

storing the fifth set of path metric values in the second memory buffer;

generating a third set of decision bits based on the fifth set of path metric values;

storing the first, second, and third sets of decision bits in a trace back register;

extracting a first state based on the fifth set of path metric values, wherein the first state is represented by a binary number that includes a plurality of bits;

extracting a first predetermined number of most significant bits from the binary number to generate an offset value;

extracting the remaining bits, after the extraction of the first predetermined number of most significant bits, from the binary number to generate an index value;

reading a plurality of decision bits from the trace back register using the offset value;

extracting a first decoded bit from the plurality of decision bits using the index value;

extracting a second decoded bit from the trace back register using the first decoded bit; and providing the first and second decoded bits as the most recent decoded data bits.

2. The method of claim 1, wherein the Viterbi decoder is operating in a forward trace mode when generating the first, second, and third sets of decision bits.

3. The method of claim 1, wherein the trace back register has first, second and third sections.

4. The method of claim 3, wherein the first set of decision bits is stored in the first section of the trace back register.

5. The method of claim 4, wherein the second set of decision bits is stored in the second section of the trace back register.

6. The method of claim 5, wherein the third set of decision bits is stored in the third section of the trace back register.

7. A method for decoding a convolutionally encoded data stream using a Viterbi decoder, wherein the Viterbi decoder operates in a trace back mode, the method comprising:

obtaining a first state of the Viterbi decoder, wherein the first state is represented by a binary number that includes a plurality of bits;

extracting a first predetermined number of most significant bits from the binary number to generate an offset value;

extracting the remaining bits, after the extraction of the first predetermined number of most significant bits, from the binary number to generate an index value;

reading a plurality of decision bits from a trace back register using the offset value;

extracting a first decoded bit from the trace back register using the index value, wherein the first decoded bit is one of the plurality of decision bits stored in the trace back register;

extracting a second decoded bit from the trace back register using the first decoded bit; and providing the first and second decoded bits as the most recent decoded data bits.

8. The method of claim 7, wherein the Viterbi decoder operates based on a constraint length that corresponds to an encoder that generated the convolutionally encoded data stream.

9. The method of claim 7, wherein the first predetermined number of most significant bits used for generating the offset value is determined by the width of the binary number.

10. A digital signal processor for decoding a convolutionally encoded data stream, wherein the convolutionally encoded data stream includes a stream of encoded data and soft decision values, the digital signal processor comprising:

a Viterbi decoder module comprising:

first and second memory buffers;

a trace back register;

a data receiving module configured to receive the convolutionally encoded data stream, wherein the data receiving module stores the soft decision values in the first memory buffer;

a branch metric calculating module configured to calculate first and second sets of branch metric values based on the stream of soft decision values;

a path metric calculating module configured to:

calculate third and fourth sets of path metric values based on at least one of a first set of path metric values, a second set of path metric values, and the first set of branch metric values; and calculate a fifth set of path metric values based on at least one of the third and fourth sets of path metric values and the second set of branch metric values, wherein the fifth set of path metric values are stored in the second memory buffer;

a decision bit generator module configured to generate first, second and third sets of decision bits based on the third, fourth and fifth sets of path metric values respectively, wherein the decision bit generator module stores the first, second and third sets of decision bits in the trace back register;

a state module configured to extract a first state based on the fifth set of path metric values, wherein the first state comprises a plurality of bits;

an offset calculating module configured to extract a first predetermined number of most significant bits from the first state to generate an offset value;

an index calculating module configured to extract the remaining bits after the extraction of the first predetermined number of most significant bits from the first state to generate an index value; and a decoded data generation module configured to:

read a plurality of decision bits from a trace back register using the offset value; and extract first and second decoded bits from the plurality of decision bits based on the index value.

11. The digital signal processor of claim 10, wherein the first, second, third, fourth and fifth sets of path metric values correspond to first, second, third, fourth and fifth sets of states, wherein the third and fourth sets of states are the next expected states of the first and second sets of states, and wherein the fifth set of states is the next expected state of the third and fourth sets of states.

12. The method of claim 1, wherein the Viterbi decoder operates in a trace back mode when extracting the first and second decoded bits.

13. The method of claim 1, wherein the Viterbi decoder operates based on a constraint length that corresponds to an encoder that generated the convolutionally encoded data stream.

14. The method of claim 1, wherein the first predetermined number of most significant bits used for generating the offset value is determined by the width of the binary number.

15. The method of claim 10, wherein extracting first and second decoded bits from the plurality of decision bits based on the index value comprises:

extracting a first decoded bit from the plurality of decision bits using the index value;

extracting a second decoded bit from the trace back register using the first decoded bit; and providing the first and second decoded bits as the most recent decoded data bits.

* * * * *